United States Patent [19]

Britton et al.

[11] Patent Number: 5,396,126

[45] Date of Patent: Mar. 7, 1995

[54] FPGA WITH DISTRIBUTED SWITCH MATRIX

[75] Inventors: Barry K. Britton, Schnecksville, Pa.; Dwight D. Hill, San Carlos, Calif.; William A. Oswald, Allentown, Pa.

[73] Assignee: AT&T Corp., Murray Hill, N.J.

[21] Appl. No.: 19,963

[22] Filed: Feb. 19, 1993

[51] Int. Cl.⁶ .......................................... H03K 19/173
[52] U.S. Cl. ........................................ 326/41; 326/39
[58] Field of Search ........................ 307/465.1, 465.9

[56] References Cited

U.S. PATENT DOCUMENTS

| | | | |
|---|---|---|---|
| 4,870,302 | 9/1989 | Freeman | 307/465 |
| 5,144,166 | 9/1992 | Camarota | 307/465.1 |
| 5,204,556 | 6/1993 | Shankar | 307/465 |
| 5,225,203 | 10/1993 | Agrawal | 307/465.1 |
| 5,323,069 | 6/1994 | Smith | 307/465.1 |
| 5,327,023 | 7/1994 | Kawana et al. | 307/465 |

OTHER PUBLICATIONS

"Fully Configurable Versatile Field Programmable Function Element", by Dwight D. Hill, Application filed Apr. 2, 1991, Ser. No. 07/679370.

Paper handed out at the Second International Workshop on Field Programmable Logic and Applications, "A New Architecture for High-Performance FPGAs," by D. D. Hill et al., Vienna, Austria, Aug. 31, 1992.

*Primary Examiner*—Edward R. Westin
*Assistant Examiner*—Andrew Sanders
*Attorney, Agent, or Firm*—James H. Fox

[57] ABSTRACT

A field programmable gate array (FPGA) includes a distributed switch matrix for programmably connecting the various routing conductors. The distributed switch matrix comprises groups of additional conductors, referred to as "Switching R-nodes". The Switching R-nodes programmably connect selected ones of the (e.g, horizontal) routing conductors to other selected ones of the (e.g., vertical) routing conductors. In this manner, the direct connection between the routing conductors may be avoided, allowing for a reduced number of programmable interconnect devices. In one preferred embodiment, a nibble-mode architecture is used, wherein four data conductors are provided for each group of routing conductors, with other multiples-of-four data conductors also being advantageous.

13 Claims, 3 Drawing Sheets

FPGA WITH DISTRIBUTED SWITCH MATRIX

BACKGROUND OF THE INVENTION

1. Field of the Invention

The present invention concerns an integrated circuit that implements a field programmable gate array (FPGA).

2. Description of the Prior Art

Integrated circuits (ICs) have traditionally implemented a single function, or else functions that were defined by software programming. However, in either case, the logic architecture that implemented the functionality was fixed during the design of the IC. More recently, integrated circuits have been developed whose logic architecture can be changed after manufacture. For example, Programmable Logic Devices (PLDs) and Field Programmable Gate Arrays (FPGAs) have been developed whose logic functions can be established by the user. One type of FPGA implementation is shown, for example, in U.S. Pat. No. 4,870,302. Referring to FIG. 1, a typical FPGA architecture is illustrated. The logic functions arc typically done in Programmable Function Units (PFUs) 100, 101, 102, 103, which are alternatively referred to by workers in the art as Configurable Logic Blocks (CLBs). Each PFU includes various logic circuit elements (AND gates, OR gates, NAND gates, NOR gates, flip-flops, multiplexers, registers, latches, and tristate buffers, for example ) that may be connected in a desired arrangement in order to implement desired logic and memory functions. For example, typical logic functions include combinatorial logic, adders, counters, and other data path functions. Furthermore, the connections between the PFUs may also be established as desired. Some of the means used or proposed for establishing the desired connectivity within and/or between PFUs include fuses, anti-fuses, and pass transistors controlled by program registers or electronically-erasable programmable read-only memories (EEPROMs), for example.

As illustrated in FIG. 1, the PFUs are connected together by Routing Nodes (R-nodes), being illustratively the conductors in groups 104, 105, 106 and 107. In addition, Configurable Interconnect Points (CIPs) arc used to connect two or more R-nodes together. The CIPs may be grouped as C-blocks (e.g., 108) and S-blocks (e.g., 109), whose functions arc described below. Due to their symmetric layout, FPGAs may conceptually be divided into more or less identical blocks of circuitry called Programmable Logic Cells (PLCs). For example, a given PLC (117) typically includes a single PFU (101), and the associated R-nodes and CIPs as described above. Around the periphery of the integrated circuit are programmable Input/Output cells (e.g., 111, 112), also referred to as "PIC" herein. These include Input/Output blocks (e.g., 113, 114, 115 and 116) that communicate externally to the integrated circuit via bondpads (e.g., 117, 118, 119, 120).

In the current FPGA architectures, the R-nodes are typically broken into two classes:

Access R-nodes: The input and output R-nodes used to route signals into or out of a PFU or Programmable Input/Output cell (PIG). For example, conductor groups 104 and 105 that connect to PFU 100 are referred to as the PFU Access R-nodes herein. Similarly, the input and output R-nodes used to route signals into or out of a Programmable Input/Output cell (PIC) are referred to as a PIC Access R-nodes.

Inter-Block R-nodes: The R-nodes used to route from one block to another block. For example, conductor group 106 that connects C-block 108 and S-block 109, and conductor group 107 that connects S-block 109 and C-block 110.

Connections are typically made from the Access R-nodes to/from the Inter-Block R-nodes by directly connecting the two R-nodes together with a CIP (a buffer may or may not be included). These types of connections are typically grouped into a block for each PLC called a connection block (C-Block). For example, if a signal is an output of a PFU (100) it is placed on an output PFU Access R-node (e.g., in group 105) and may then be placed on a horizontal Inter-Block R-node (e.g., in group 107) by turning on a CIP (e.g., in block 110) that directly connects the two R-nodes. Similarly, if a signal is an input to a PFU it would be taken from an Inter-B lock R-node and then placed on an input PFU Access R-node by again turning on a CIP that directly connects the two R-nodes. Connections between the Inter-Block R-nodes are also made by directly connecting the two R-nodes together with a CIP (again a buffer may or may not be included). For example, if the horizontal Inter-Block R-node above is to "turn a corner" and be placed on a vertical Inter-Block R-node, this is accomplished by turning on a CIP that directly connects the two R-nodes. These types of connections are typically grouped into a block for each PLC called a switch matrix block (S-Block).

FIGS. 2(A) and 2(B) then show an example of how the connections inside the C-Block and S-Block can be implemented. In FIG. 2(A), a C-block is illustrated, wherein the vertical routing conductors 201 and 202 may be selectively connected to the horizontal routing conductor 203 by means of the CIPs 205 and 205. Similarly, the vertical routing conductors may be connected to the other horizontal conductors 204, 207, 208, 209 and 210 by the other CIPs illustrated. As shown in FIG. 2(A), each CIP is illustrated as a diamond, and typically comprises a field effect transistor having a first source/drain region connected to the vertical conductor, and a second source/drain region connected to the horizontal conductor. The gate of the transistor is controlled by a register (not shown), or other means of storing the desired connectivity information. In the case of an n-channel transistor, when the gate voltage on the transistor is high, the transistor conducts, which connects the two conductors. For purposes of illustration herein, a filled-in diamond illustrates the case of a conducting CIP. When the gate voltage is low, the transistor does not conduct. This is illustrated herein as an open diamond for the CIP. As described above, these connections may alternatively be made by fuses, anti-fuses, etc.

In FIG. 2(B ), a typical S-block 250 is illustrated. The vertical conductor 251 is selectively connected to the horizontal conductor 253 by means of transistor 257, and to the horizontal conductor 254 by means of transistor 258. Similarly, the vertical conductor 263 is selectively connected to horizontal conductors 253 and 254 by means of transistors 259 and 260, respectively. The vertical conductors 251 and 263 are selectively connected together by transistor 262, whereas the horizontal conductors 253 and 254 are selectively connected together by transistor 261. In an analogous manner, the vertical conductors 252 and 264 and the horizontal conductors 255 and 256 may be selectively connected by the other transistors shown.

The problem with the above-type of architecture is that for every pair of R-nodes that need to be connected together a CIP is needed. Since each of these CIPs consist of components of significant size, this greatly increases the size of the FPGA. Due to this size increase, FPGA architectures have tended to allow only a subset of the possible connections between multiple pairs of R-nodes. But this reduction in the number of possible connections between R-nodes makes it more difficult to route designs on a given FPGA. Therefore, it would be desirable to have an FPGA routing architecture that would allow for fewer CIPs to be used to route multiple R-nodes together. Thus the overall size of the routing architecture could be smaller.

SUMMARY OF THE INVENTION

We have invented a Field Programmable Gate Array having a hierarchical set of routing resources. In this design, an additional set of R-nodes, called Switching R-nodes, are included to route signals between, or among, R-node conductor groups. For example, the Switching R-nodes may be used to connect Access R-nodes and the Inter-Block R-nodes, as well as to connect the Inter-Block R-nodes. In a typical case, a first (e.g, horizontal) Inter-Block R-node is connected to a second (e.g., vertical) Inter-Block R-node by means of a Switching R-node. As a result, there need be no direct connections between any of the Inter-Block R-nodes, although a few direct connections may be advantageous, especially for speed purposes. Connections from one Access R-node to another Access R-node are also possible, as to provide feedback to a given PFU, or to connect PFUs in adjacent programmable logic cells.

DETAILED DESCRIPTION

The following detailed description relates to an FPGA that includes a distributed switch matrix for programmably connecting the routing conductors. The distributed switch matrix comprises groups of additional conductors, referred to as "Switching R-nodes" herein. The Switching R-nodes programmably connect selected ones of the routing conductors to other selected ones of the routing conductors. In this manner, the direct connection between the conductors may be avoided, allowing for a reduced number of programmable interconnect devices. In many cases, connections between horizontal and vertical routing conductors are provided, but connections between routing conductors in other orientations are possible, as discussed below.

Figure 3:
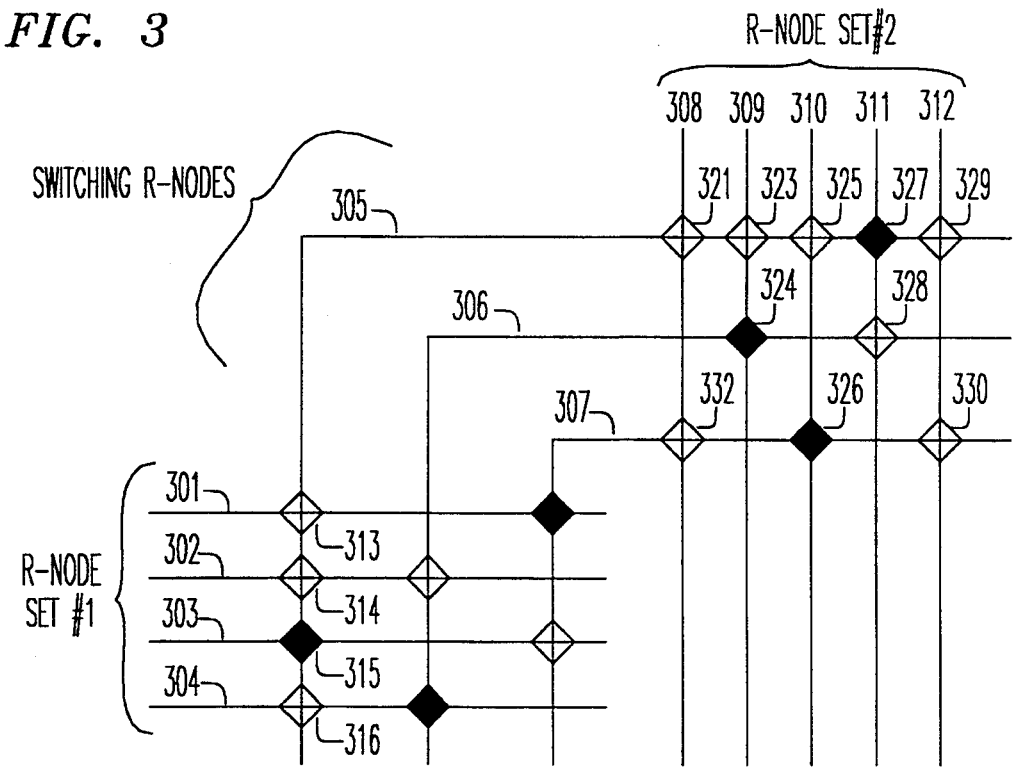
FIG. 3 shows one embodiment of the inventive Switching matrix.

Referring to FIG. 3, an exemplary embodiment of the present invention is shown. The Switching matrix R-nodes (305–307) selectively connect the R-nodes in the horizontal set #1 (conductors 301–304) and the vertical set #2 (conductors 308–312), by means of the associated CIPs (313–330) that are turned on (conducting). For example, the R-node conductors 301 and 310 are connected by means of Switching R-node conductor 307 and turned-on CIPs 319 and 326. Similarly, R-node conductors 303 and 311 are connected by means of Switching R-node conductor 305 and turned-on CIPs 315 and 327. Also, R-node conductors 304 and 309 are connected by means of Switching R-node conductor 306 and turned-on CIPs 318 and 324. The other CIPs are turned off; i.e., non-conducting. Note that each of the switching R-nodes has at least two CIPs associated with it: at least one CIP is provided to connect the Switching R-node to at least one conductor in R-node set #1, and at least one CIP is provided to connect the Switching R-node to at least one conductor in R-node set #2. As will be further explained below, the R-node sets #1 and #2 may be either Block Access R-nodes, or alternatively Inter-Block R-nodes.

Figure 5:
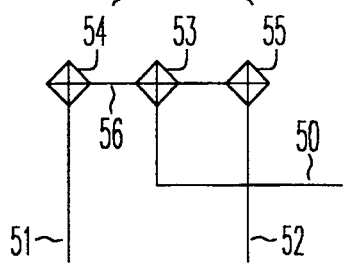
FIGS. 5 and 6 show exemplary conductors layouts for implementing the Switching R-nodes.
Figure 6:
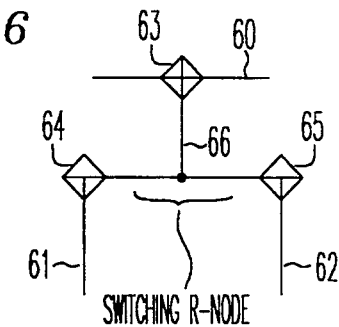

The three sets of R-nodes are typically formed in two or more conductor levels, typically metal, which are dielectrically isolated from one another. For example, the R-node set #1 may be in a first metal level, and the R-node set #2 in a second metal level, with the Switching R-nodes formed in either level. However, if desired, even a single conductor level can be used. For example, a single metal level may be used for the R-nodes, with jumpers of polysilicon (or another conductor type) provided at the cross-over locations. The CIPs are typically formed in the underlying semiconductor substrate, which may be contacted by the R-node conductors through window openings and inter-level vias according to techniques known in the integrated circuit art. While FIG. 3 shows the logic of the Switching R-node technique, the physical layout may be quite different. For example, referring to FIG. 5, one layout shows that the switching R-node comprises conductor segment 56 that selectively connects vertical R-nodes 51 and 52 to horizontal R-node 50, by means of CIPs 53, 54 and 55. Referring to FIG. 6, another layout shows a Switching R-node 66 that selectively connects vertical R-nodes 61 and 62 to horizontal R-node 60, by means of CIPs 63, 64 and 65.

In a typical application of the present invention where a signal is an output of a PFU, it is placed on an output PFU Access R-node, then routed to a Switching R-node, and then routed to an Inter-Block R-node. For a PFU input, the signal is taken from an Inter-Block R-node, routed onto a Switching R- node, and then muted to an input PFU Access R-node. If multiple PFU Access R-nodes and Inter-Block R-nodes can be connected to the same Switching R-node through the use of CIPs, then fewer CIPs can be used to make the needed connections between the PFU Access R-nodes and the Inter-Block R-nodes than in previous FPGA architectures. Although there are many possible connections that can be made, each Switching R-node typically carries only one signal at a time. Therefore, in the current implementation, multiple Switching R-nodes are used to allow multiple connections between PFU Access R-nodes and Inter-Block R-nodes. For the above example where two Inter-Block R-nodes are routed together, the signal on one of the Inter-Block R-nodes would be routed onto a Switching R-node, then routed from the Switching R-node to the other Inter-Block R-node. As before, if multiple Inter-Block R-nodes can be connected to the same Switching R-node, then less CIPs can be used to make the needed connections between them than in previous FPGA architectures. Also as before, although for one Switching R-node there are many possible connections that can be made, only one connection can be made for one signal at a time. Therefore, in the current implementation, multiple Switching R-nodes are used to allow multiple connections between the two groups of Inter-Block R-nodes.

Figure 4:
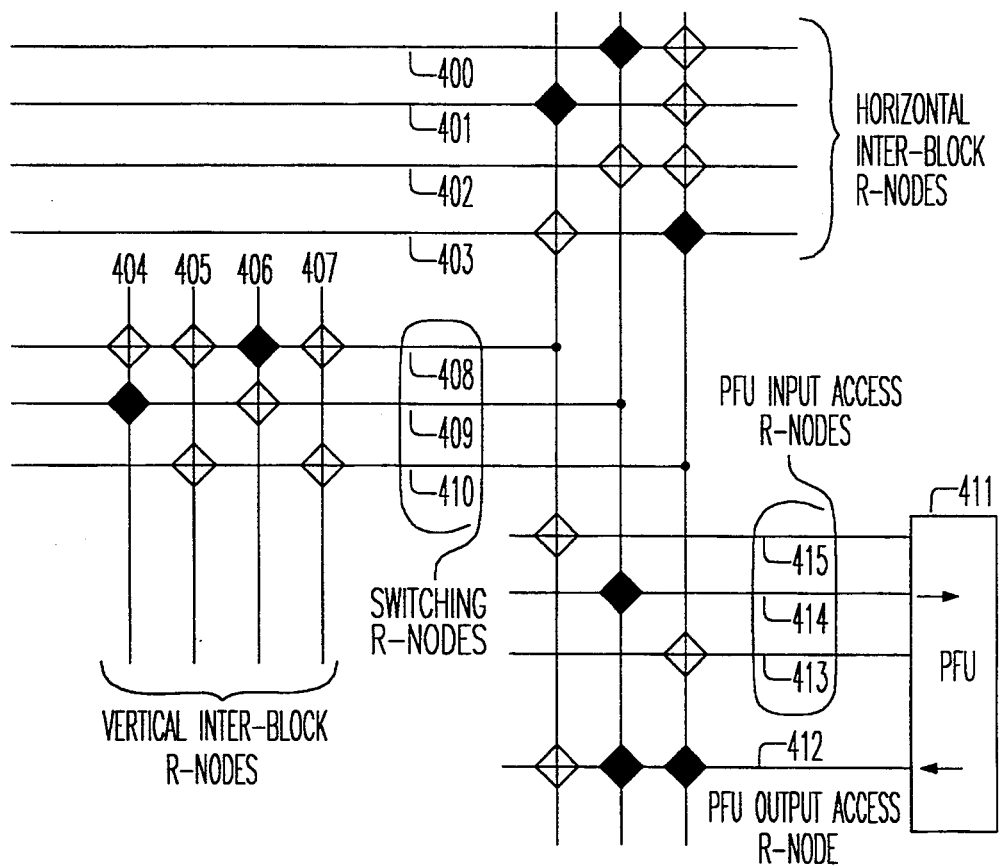
FIG. 4 shows another embodiment of the inventive Switching matrix.

A third type of routing, PFU feedback routing, can also be done with Switching R-nodes. This is done by routing an output Access R-node to a Switching R-node, and then from the Switching R-node to an input Access R-node. Thus, the inter-PFU routing is saved to route between different PFUs. if the Switching R-nodes discussed above are actually the same set of Switching R- nodes, then these Switching R-nodes may have all three functions of: (1) PFU Access-node to Inter-Block R-node routing; (2) Inter-Block R-node to Inter- Block R-node routing, and (3) PFU feedback routing. Thus the Inter-Block R- nodes do not have to make connections to three sets of Switching R-nodes (in other words one set for each type of routing) and the number of CIPs can be reduced further. This also allows a Switching R-node to perform all three functions at the same time. FIG. 4 then shows how a single Switching R-node can perform all three types of connections at the same time for a given signal. As used with regards to the present invention, a "block" may be considered to be a given PFU (or Input/Output cell) and the Access R-nodes that are directly connected to it. Therefore, an Inter-Block R-node provides a connection between two PFU's via their associated Access R-nodes. Note that more than one Inter-Block R-node may be involved in making the aforesaid connection, as when a vertical Inter-B lock R-node connects to a horizontal Inter-Block R-node.

Referring further to FIG. 4, the horizontal Inter- Block R-nodes 400–403 and vertical Inter-Block R-nodes 404–407 are selectively connected by means of the Switching R-nodes 408–410, and the associated CIPs. For example, as indicated: the Inter-Block R-nodes 400 and 404 are connected via Switching R-node 409; and the Inter-Block R-nodes 401 and 406 are connected via Switching R-node 408. Therefore, the Switching R-nodes provide the function noted above of selectively connecting the Inter-Block R-nodes. In addition, as indicated: the input access R-node 414 and the output access R-node 412 are connected to both the Inter-Block R-nodes 400 and 404 via Switching R-node 409. Similarly, the output access R-node 412 is connected to the Inter-Block R-node 403 via Switching R-node 410. Hence, the Switching R-nodes also provide the function of selectively connecting the Access R-nodes of PFU 411 to the Inter-Block R-nodes. Note also the the Switching R-node 409 connects the PFU Output Access R-node 412 to the PFU Input Access R-node 414, providing for PFU feedback. Thus, Switching R-node 409 performs all three functions at the same time. Still other connections are possible, as indicated by the non-conducting CIPs shown in FIG. 4.

Figure 1:
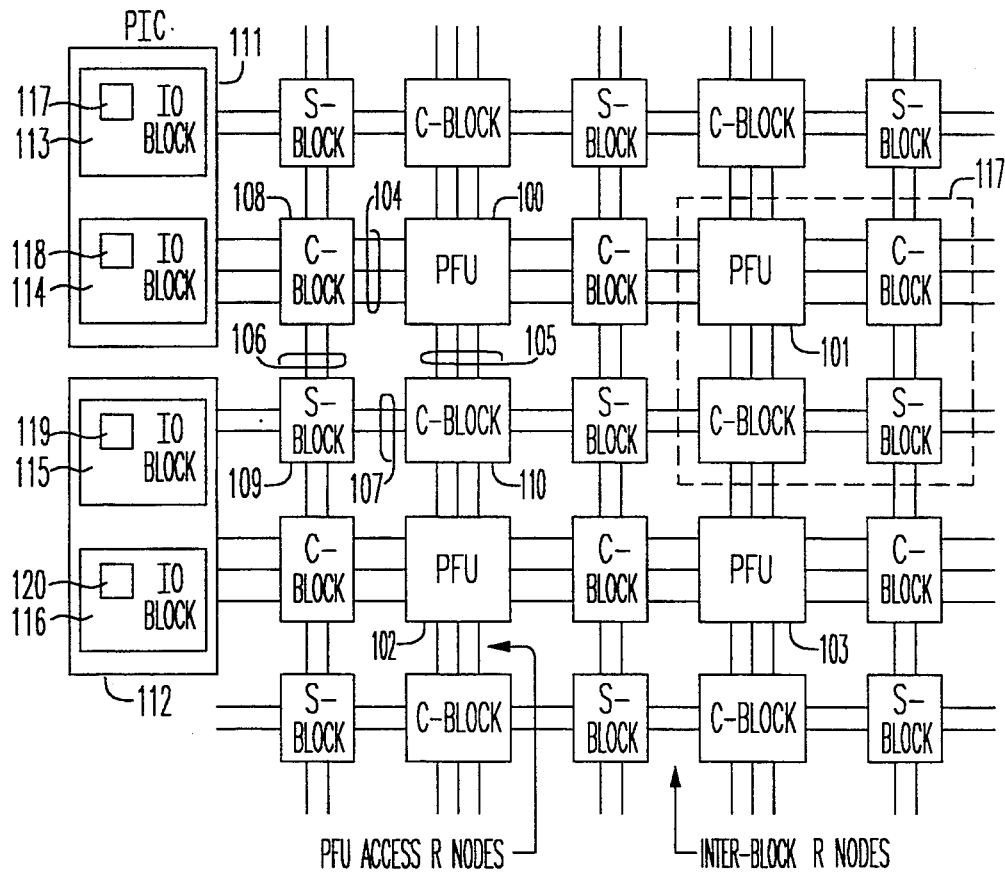
FIG. 1 shows the typical prior-art FPGA routing architecture.
Figure 2A:
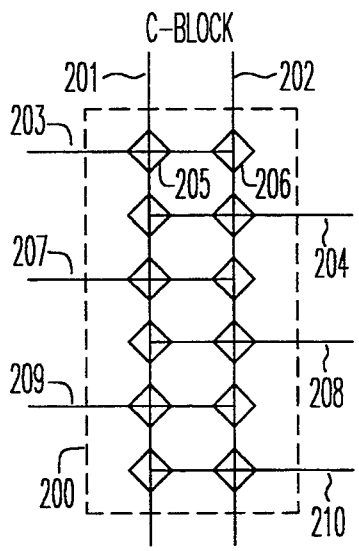
FIG. 2 shows typical prior-art C-block and S-block routing.
Figure 2B:
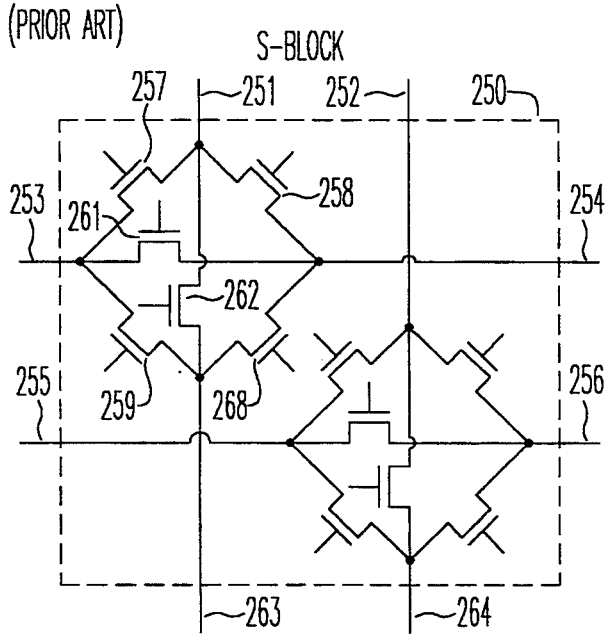

In one current implementation, the Switching R-nodes are broken into four sets of five R-nodes, one for each corner of the PLC. Each of these sets of R-nodes has the ability to connect together the Inter-Block R-nodes that are in their corner of the PLC, as well as connect the Inter-Block R-nodes in that corner to the PFU Access R-nodes of the PFU, as well as to connect the PFU Access R-nodes of the PFU together. For example an output PFU Access R-node can be routed to and input PFU Access R-node, thus allowing feedback into the PFU. The Switching R-nodes in each group advantageously includes 4 data conductors to provide a nibble (4 bits) of data to the user, and also includes one (or more) control conductors to be routed in each corner of the PLC. R-node groups that include multiples of 4 data conductors (e.g., 8) are also advantageous in some cases. However, the number of groups and the number of bits per group may be any number that is desired. The R-nodes that connect to the programmable Input/Output cells (e.g., 111, 112 in FIG. 1) may be interconnected by Switching R-nodes in a similar manner to that described herein for the PFU Access R-nodes and Inter-Block R-nodes.

Figure 8:
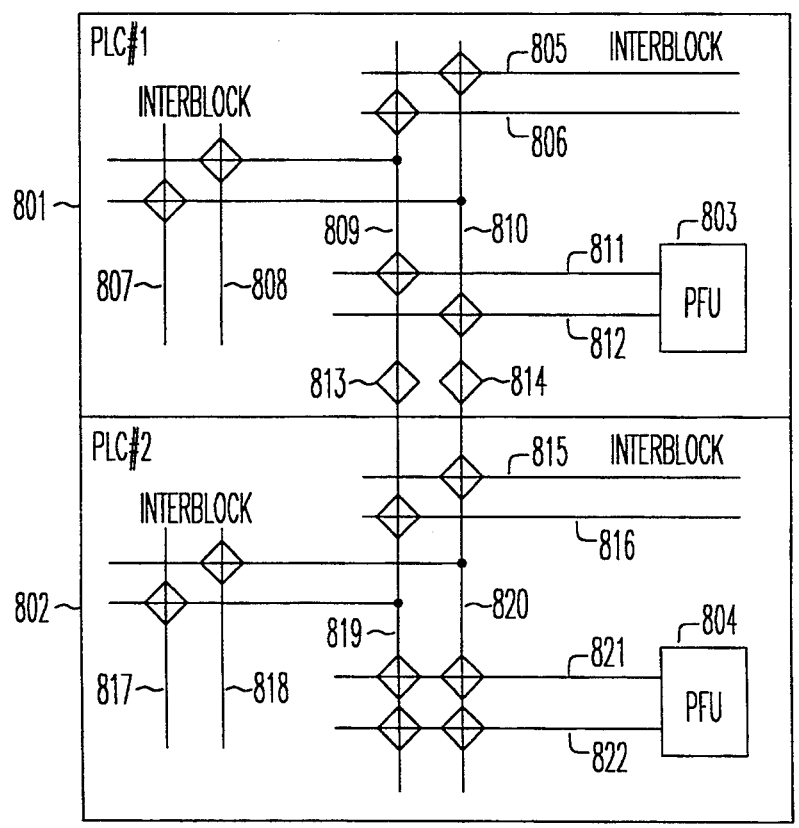
FIG. 8 shows the connection of two switching R-nodes in adjacent programmable logic cells.

Referring to FIG. 8, two adjacent programmable logic cells 801 and 802 are illustrated. They each include horizontal Inter-Block R-nodes (805–806 and 815–816) and vertical Inter-Block R-nodes (807–808 and 817–818). In addition, each PLC includes PFU access R-nodes (811–812 and 821–822). Also, each PIE includes Switching R-nodes (809–810 and 819–820) that selectively connect the following:

(1) the PFU Access R-nodes to the horizontal and vertical Inter-Block R-nodes;

(2) the horizontal and vertical Inter-Block R-nodes to each other; and (3) the PFU Access R-nodes in a given PIE together to provide feedback.

However, in addition, note that the Switching R-nodes from two different PLCs may be selectively connected to each other, by means of the CIPs 813 and 814. This allows for a direct signal path between adjacent PLCs, which speeds performance by avoiding the use of the Inter-Block R-nodes in this case. In addition, it frees the Inter-Block R-nodes for other uses.

Figure 7:
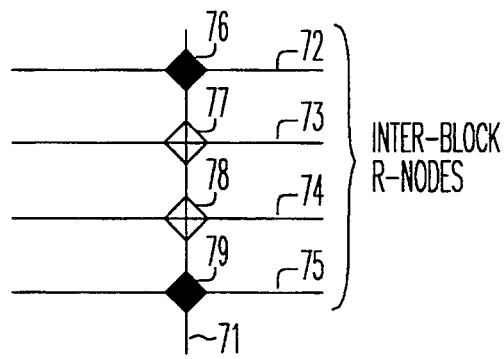
FIG. 7 shows an alternative embodiment of the invention.

While the Switching R-nodes are shown in FIGS. 4 and 8 as connected to only one corner of a given PLC, in a typical case additional Switching R-nodes also connect to the other corners, so that a symmetrical connection scheme for all four corners of each PIE is provided. Finally note that while the Switching R-nodes typically provide connections between Inter-Block R-nodes lying along two different axis of the array (e.g., horizontal and vertical), that is not necessarily the case. For example, FIG. 7 shows the case wherein the switching R-node 71 selectively connects the conductors 72–75 lying in the same (e.g., horizontal) axis. In particular, the turned-on CIPs 76 and 79 provide a connection between the R-nodes 72 and 75 in the illustrated case. Also, even if the R-nodes lie along different axes, they need not be perpendicular. For example, two groups of R-nodes may lie along axes that are diagonal to each other. However, in most cases,,one of the axes is the same as the major axis of the array of PFUs.

We claim:

1. An integrated circuit that implements a programmable logic function, and comprising:
    an array of programmable function units;
    a plurality of groups of first routing conductors; and
    a plurality of groups of second routing conductors,
    Characterized in that said integrated circuit further comprises a plurality of groups of third routing conductors, wherein each of said third routing conductors includes at least two programmable interconnect means for programmably connecting a selected one of said first routing conductors to a selected one of said second routing conductors.

2. The integrated circuit of claim 1 wherein said groups of routing conductors each comprise four data conductors.

3. The integrated circuit of claim 2 wherein said groups of routing conductors each further comprise at least one control conductor.

4. The integrated circuit of claim 1 wherein a first group of said first routing conductors provides access to a first programmable function unit, or alternatively to a first programmable Input/Output cell, and a second group of said second routing conductors are Inter-Block routing conductors, and a third group of said third routing conductors programmably interconnects the conductors in said first group and said second group.

5. The integrated circuit of claim 1 wherein a first group of said first routing conductors are Inter-Block routing conductors, and a second group of said second routing conductors are also Inter-Block routing conductors, and wherein a third group of said third routing conductors programmably interconnects the conductors in said first group and said second group.

6. The integrated circuit of claim 1 wherein a first group of said first routing conductors provides access to inputs and outputs of a first programmable function unit, and at least one of said third routing conductors connects an output access routing conductor to an input access routing conductor of a given programmable function unit, whereby feedback is provided.

7. The integrated circuit of claim 1 wherein said first routing conductors are parallel to a first axis of said array, and said second routing conductors are parallel to a second axis of said array.

8. The integrated circuit of claim 1 wherein at least one group of said first routing conductors and at least one group of said second routing conductors are parallel to the same axis of said array.

9. An integrated circuit that implements a programmable logic function, and comprising:
   an array of programmable function units;
   a group of first routing conductors aligned parallel to a first axis of said array; and
   a group of second routing conductors aligned parallel to a second axis that is different from said first axis;
   Characterized in that said integrated circuit further comprises a group of third routing conductors, and wherein each of said third routing conductors includes at least two programmable interconnect means for programmably connecting selected ones of said first routing conductors to selected ones of said second routing conductors.

10. The integrated circuit of claim 9 wherein a first group of said first routing conductors provides access to a first programmable function unit, or alternatively to a first programmable Input/Output cell, and a second group of said second routing conductors are Inter-Block routing conductors, and a third group of said third routing conductors programmably interconnects the conductors in said first group and said second group.

11. The integrated circuit of claim 9 wherein a first group of said first routing conductors are Inter-Block routing conductors, and a second group of said second routing conductors are also Inter-Block routing conductors, and wherein a third group of said third routing conductors programmably interconnects the conductors in said first group and said second group.

12. The integrated circuit of claim 9 wherein a first group of said first routing conductors provides access to inputs and outputs of a first programmable function unit, and at least one of said third routing conductors connects an output access routing conductor to an input access routing conductor of a given programmable function unit, whereby feedback is provided.

13. An integrated circuit comprising at least two adjacent programmable logic cells each comprising:
   a programmable function unit,
   a group of access routing conductors connected to inputs and outputs of the programmable function unit; and
   a group of inter-block routing conductors;
   Characterized in that said adjacent programmable logic cells each further comprise a group of switching routing conductors, wherein each of said switching routing conductors includes at least two programmable interconnect means, that programmably connect said group of access routing conductors and said group of inter-block routing conductors;
   and further characterized in that group of switching routing conductors in one of said adjacent programmable logic cells also programmably connect to at least one group of switching routing conductors in another of said adjacent programmable logic cells.

* * * * *